United States Patent [19]

Ohhinata et al.

[11] 4,031,412
[45] June 21, 1977

[54] MEMORY CIRCUIT

[75] Inventors: Ichiro Ohhinata, Yokohama; Shinzi Okuhara, Fujisawa, both of Japan

[73] Assignee: Hitachi, Ltd., Japan

[22] Filed: Dec. 23, 1975

[21] Appl. No.: 643,757

[30] Foreign Application Priority Data

Dec. 27, 1974 Japan .................. 50-148637

[52] U.S. Cl. .............................. 307/238; 307/255; 307/288; 307/300

[51] Int. Cl.² .................. H03K 17/00; G11C 11/40

[58] Field of Search .......... 307/284, 288, 255, 300, 307/238

[56] References Cited

UNITED STATES PATENTS

| | | | |
|---|---|---|---|
| 3,105,158 | 9/1963 | Nichols | 307/300 |
| 3,343,104 | 9/1967 | Motto Jr. | 307/284 |
| 3,569,945 | 3/1971 | Ho | 307/300 |

Primary Examiner—Stanley D. Miller, Jr.
Assistant Examiner—B. P. Davis
Attorney, Agent, or Firm—Craig & Antonelli

[57] ABSTRACT

A memory circuit comprises a semiconductor element circuit having equivalently a PNPN four-layer structure, at least an NPN transistor and a diode. An N-type emitter of the semiconductor element circuit is connected to the base of the NPN transistor, while a P-type base of the circuit is connected to the collector of the NPN transistor through the diode. The semiconductor element circuit has a positive feedback loop which is additionally provided with another feedback loop extending across the P-type base and the N-type emitter of the semiconductor element circuit, whereby in the ON holding state of the memory circuit the semiconductor element circuit is operated as a current stabilizing circuit and the transistor included in the additional feedback loop is stabilized in a controlled staturation state. The memory circuit can thus be operated at a high speed with a low power consumption.

10 Claims, 7 Drawing Figures

MEMORY CIRCUIT

The present invention relates to a memory or storage circuit. In particular, the invention relates to a memory circuit including a semiconductor element circuit designed to have equivalently a PNPN four-layer structure.

As is well known, the semiconductor element having a PNPN four-layer structure or a semiconductor element circuit composed of a PNP transistor and an NPN transistor which are so combined as to constitute equivalently the PNPN four-layer structure has a self-holding function and is employed as a memory or storage circuit. The memory circuit having the PNPN four-layer structure provides a great advantage as compared with a flip-flop memory circuit in that the nonconduction (or OFF) holding power (quiescent power) can be made zero.

However, the conventional memory circuit including a semiconductor element circuit in a PNPN structure has the following drawbacks:

1. The operation speed or the switching speed is not sufficiently high;
2. Power consumption is great; and
3. The ON-holding current is varied depending upon a variation of a source voltage applied to the circuit.

Accordingly, an object of the present invention is to provide a memory circuit comprising a semiconductor element circuit having equivalently a PNPN four-layer structure which can operate at a high speed while enjoying the advantage of the OFF- holding power being zero.

Another object of the invention is to provide a memory or storage circuit which can operate with low power and has characteristics hardly susceptible to the influences of variations in the source voltage nor to unevenness of the characteristics of the resistances, transistors or the like.

According to the present invention there is provided a memory circuit comprising: a semiconductor element circuit having equivalently a PNPN four-layer structure and inherently a positive feedback loop circuit; another feedback loop circuit in cooperation with the positive feedback loop circuit including at least one diode and an NPN transistor; and means for setting the NPN transistor in a controlled saturation state for ON-holding the memory circuit.

The above and other objects, novel features and advantages of the invention will become apparent from the following description of preferred embodiments of the invention in connection with the accompanying drawings, in which.

For better understanding of the invention, reference will first be made to the conventional memory circuits somewhat in detail.

Figure 1:
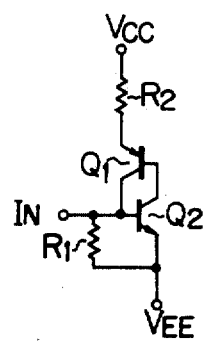
FIGS. 1 and 2 show arrangements of the conventional memory circuits of PNPN four-layer structure.

A fundamental circuit arrangement of a hitherto known memory circuit is shown in FIG. 1, wherein the memory circuit includes PNP and NPN transistors $Q_1$ and $Q_2$ combined so as to constitute equivalently a PNPN four-layer structure. Reference symbol $R_1$ denotes a protection resistor for preventing an erroneous conduction due to $dv/dt$ rate effect unique to the memory circuit of the PNPN four-layer structure, and $R_2$ denotes a resistor for limiting the holding current. Like the commonly known PNPN four-layer structure, this memory circuit has inherently an internal positive feedback loop such that a base current supplied to the transistor $Q_2$ from the terminal IN is amplified by the transistor $Q_2$ and the amplified current appearing on the collector of the transistor $Q_2$ is then fed to the base of the transistor $Q_1$, where the base current is further amplified and is fed from the collector of the transistor $Q_1$ back to the base of the transistor $Q_2$ where the base current is further amplified and so forth. Thus, once a predetermined base current is supplied to the transistor $Q_2$, the transistors $Q_1$ and $Q_2$ are kept in ON or conductive state even though the base current externally supplied to the transistor $Q_2$ ceases, i.e., the PNPN four-layer structure such as shown in FIG. 1 has a self-holding function. In this type of the memory circuit, the conduction or ON holding operation is effected by saturating the transistors $Q_1$ and $Q_2$. For this reason, it requires a relatively long time to switch the memory circuit into the nonconduction or OFF state since electric charge stored during the saturation has to be completely discharged. Another disadvantage of the conventional memory circuit shown in FIG. 1 can be seen in the fact that the ON holding current Icc is subjected to variation upon variation of a source voltage Vcc, which also brings about large variations in the time duration for switching the circuit into the OFF state.

Figure 2:
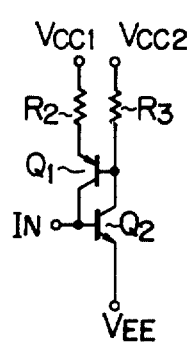

FIG. 2 shows another arrangement of a hitherto known memory circuit in which a resistor $R_3$ is employed. The resistor $R_3$ serves to restrict the saturation of the transistors $Q_1$ and $Q_2$ when the circuit is in the conduction or ON state and to apply a backward bias voltage to the base of the transistor $Q_1$ in the OFF state of the memory circuit, thereby to prevent the erroneous operation due to the $dv/dt$ rate effect. However, with such arrangement of the circuit, the current $I_{cc1}$ and $I_{cc2}$ flowing through the resistors $R_2$ and $R_3$ can not be protected from variations when the source voltages $V_{cc1}$ and $V_{cc2}$ are varied, because the transistors $Q_1$ and $Q_2$ will operate as a voltage stabilizer circuit in the ON holding state of the memory circuit. Such being the circumstances, attempts to reduce the power consumption and to attain a high operation speed have been encountered with great difficulty. In reality, the resistance values of the resistors have to be so selected as to assure a sufficient current for holding the circuit in the ON state in consideration of possible variations in the source voltage, manufacturing tolerances or unevenness in the characteristics of the resistors and transistors as well as variation in the temperature characteristics. Consequently, it has been difficult or substantially impractical to reduce the power consumption and increase the operation speed.

Figure 3:
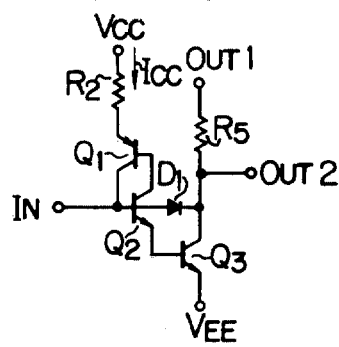
FIG. 3 is a circuit diagram showing an embodiment of the memory circuit according to the invention.

Now referring to FIG. 3 which shows in an equivalent circuit diagram a fundamental arrangement of an embodiment of the memory circuit according to the invention, reference symbols $Q_1$ and $Q_2$ denote, respectively, a PNP transistor and an NPN transistor which constitute in combination a semiconductor element circuit corresponding equivalently to a PNPN four-layer structure. A diode $D_1$ forms together with an NPN transistor $Q_3$ an additional feedback loop in cooperation with the inherent or internal positive feedback loop of the semiconductor element circuit of the equivalent PNPN four-layer structure. Connected to the emitter of the transistor $Q_1$ is a resistor $R_2$ for limiting the conduction or ON holding current, while a load resistor $R_3$ is connected to the collector of the NPN transistor $Q_3$.

In operation of the circuit shown in FIG. 3, it is noted that the ON holding state of the memory circuit is produced through the interaction of the three transistors $Q_1$, $Q_2$ and $Q_3$. More specifically, the collector current of the transistor $Q_1$ provides collector current of the transistor $Q_3$ through the shunt diode $D_1$ in addition to the base current for the transistor $Q_2$. This means a reduction in the feedback amount of current for the transistors $Q_1$ and $Q_2$, which thus become less likely to operate in the saturation region. On the other hand, the emitter current of the transistor $Q_2$ provides a base current for the transistor $Q_3$. When the transistor $Q_3$ is turned ON, it will absorb the current from the diode $D_1$ and from either the output Out 1 or Out 2. The current from the output Out 1 or Out 2 in turn enforcively requires the base current of the transistor $Q_3$ or the emitter current of the transistor $Q_2$, which compensates or increases the reduced feed-back current to the transistors $Q_1$ and $Q_2$ due to the shunt current through the diode $D_1$ and thereby contributes to the ON holding operation. In other words, as the output current is increased, the emitter current of the transistor $Q_2$ is correspondingly increased, whereby the transistors $Q_1$ and $Q_2$ tend to operate in the saturation region. On the contrary, when the output current is decreased, the emitter current of the transistor $Q_2$ is also decreased, whereby the transistors $Q_1$ and $Q_2$ will tend to operate in the active region. In this manner, the transistors $Q_1$, $Q_2$ and $Q_3$ will operate in three regions described below in dependence upon the amount of the output current.

In the first region, the transistors $Q_1$, $Q_2$ and $Q_3$ can not be held in the ON or conduction state. This corresponds to a very low supply capacity of the output current. In other words, when the output current is very small, the emitter current of the transistor $Q_2$ corresponding to the base current of the transistor $Q_3$ is decreased, resulting in the reduction of the positive feedback amount. Consequently, the negative feedback current through the diode $D_1$ will become relatively greater than the positive feedback current, whereby the circuit can not be held in the ON state.

The second region corresponds to the case in which a great supply capacity of the output current is available. When the transistors $Q_1$ and $Q_2$ are operated in the saturated region, the transistor $Q_3$ can be supplied with a maximum base current. When the output current is available which is greater than the one absorbed by the transistor $Q_3$ in response to the base current thereto, the transistor $Q_3$ can be operated in the active region. In brief, the second region corresponds to the state of the circuit in which the transistors $Q_1$ and $Q_2$ are operated in the saturation region, while the transistor $Q_3$ operates in the active region. The diode $D_1$ is then in the nonconduction or OFF state. Of course, the circuit is held in the ON state.

The third region is defined between the first and the second regions, i.e. between the lower limit value of the output current at which the circuit can be held in the ON state and the upper limit value of the output current at which the transistors $Q_1$ and $Q_2$ are operated in the active region with the transistor $Q_3$ operated in the controlled saturation region. In this third region, since the transistors $Q_1$ and $Q_2$ will operate in the active region while the transistor $Q_3$ is operated in a controlled saturated state by absorbing the current from the diode $D_1$ and the output current, the memory circuit is held in the stabilized ON state. In this context, the terminology "controlled saturation state" of the transistor $Q_3$ means the state in which the potential at the collector of the transistor $Q_3$ is clamped by the loop formed by the diode $D_1$ and the transistors $Q_2$ and $Q_3$ so that the transistor $Q_3$ is held in a shallow saturation or lightly saturated state.

As will be appreciated from the above description, the ON holding state of the memory circuit according to the invention shown in FIG. 3 is produced, when either the transistors $Q_1$ and $Q_2$ or the transistor $Q_3$ is saturated. In particular, when the third region is selected, that is, when the output current is so set that the transistors $Q_1$ and $Q_2$ are operated in the active region with the transistor $Q_3$ in the controlled saturation, the turn-off operation of the circuit can be effected at a great high speed by extracting the current from the input IN. When the transistors $Q_1$ and $Q_2$ are operated in the active region, variation in the source voltage $V_{cc}$ would advantageously result in a negligible variation in the current value $I_{cc}$ without adverse influence being exerted to the high speed operation. The current Icc flowing through the transistors $Q_1$ and $Q_2$ is determined by the output current independently from the resistor $R_2$ until the saturation has been attained. Accordingly, a relatively large range of tolerance can be allowed for the value of the resistor $R_2$, which in turn facilitates the manufacturing of the memory circuit in a form of an integrated circuit.

It will be recalled that the ON holding of the memory circuits shown in FIGS. 1 and 2 is effected by the saturated transistors $Q_1$ and $Q_2$. In contrast thereto, the ON or conduction holding of the memory circuit of FIG. 3 according to the invention is effected by the transistors $Q_1$ and $Q_2$ driven into the active region. It will thus be self-explanatory that the current required for holding the memory circuit of FIG. 3 in the ON state is smaller than the ON holding current required in the circuits shown in FIGS. 1 and 2. Thus, according to the invention, a small power consumption can be accomplished. The transistor $Q_3$ may be replaced by two transistors connected in a form of Darlington configuration. The combined PNP and NPN transistors $Q_1$ and $Q_2$ may be replaced by a single PNPN four-layer structure such as a P-gate thyristor or N-gate thyristor. The same applies to the embodiments described hereinafter.

Figure 4:
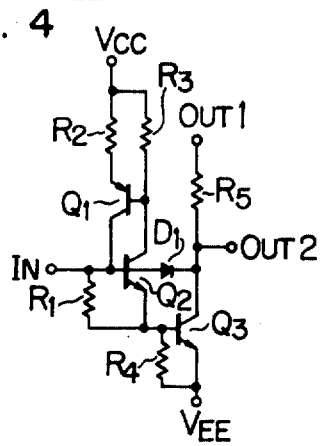
FIGS. 4, 5 and 6 show other embodiments of the memory circuit according to the invention.

FIG. 4 shows a second embodiment of the memory circuit according to the invention which is different from the circuit arrangement of FIG. 3 in that three additional resistors $R_1$, $R_2$ and $R_3$ are provided. The resistor $R_1$ serves to protect the circuit from the erroneous conduction which may be possibly brought about due to the $dv/dt$ rate effect occurring at the rising time of the source voltage Vcc. The resistor of this kind is often employed for the hitherto known element of the PNPN four-layer structure. The resistor $R_3$ serves to aid the transistors $Q_1$ and $Q_2$ with their operation in the active region. As will be shown in an experiment described hereinafter, by virtue of the provision of the resistor $R_3$, the transistors $Q_1$ and $Q_2$ can be operated in the active region even in a lower range of the source voltage Vcc, which results in a reduced power consumption. Finally, the resistor $R_4$ serves to discharge the electric charge stored in the transistor $Q_3$ and allows more rapid OFF operation. In the circuit shown in FIG. 4, the ON holding state is produced through the interaction of the transistors $Q_1$, $Q_2$ and $Q_3$. In other words, three operation state regions can be obtained in dependence upon the amount of the output current as in the case of the memory circuit of FIG. 3 by selectively setting the resistance value so that the base of the transistor $Q_3$ may be driven by the emitter current of the transistor $Q_2$. With the circuit arrangement shown in FIG. 4, an excellent memory circuit can be attained by so setting the output current that the transistors $Q_1$ and $Q_2$ operate in the active region, while the transistor $Q_3$ operates in the controlled saturation region.

Figure 5:
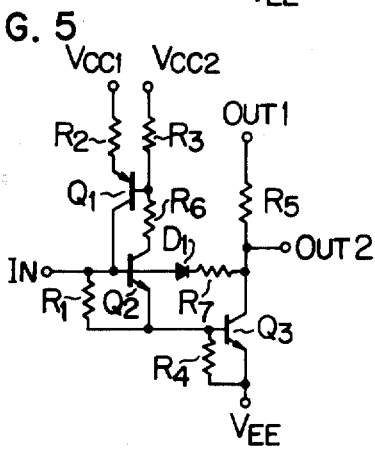

FIG. 5 shows a third embodiment of the memory circuit according to the invention. This circuit is different from the one shown in FIG. 4 in that the resistors $R_2$ and $R_3$ are supplied with current from separate voltage sources $V_{cc1}$ and $V_{cc2}$ instead of the single voltage source Vcc in the circuit of FIG. 4. Additionally, a resistor $R_6$ for adjusting the operation state is provided between the base of the PNP transistor $Q_1$ and the collector of the NPN transistor $Q_2$, which transistors $Q_1$ and $Q_2$ constitute the semiconductor element circuit having equivalently the PNPN four-layer structure. Further, a resistor $R_7$ is connected between the diode $D_1$ and the collector of the output transistor $Q_3$ for adjusting the output level and the saturation control of the transistor $Q_3$.

Figure 6:
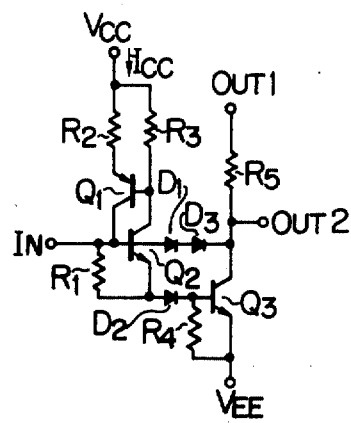

FIG. 6 shows a fourth embodiment of the memory circuit according to the present invention. In this circuit arrangement, it will be noted that diodes $D_3$ and $D_2$ are inserted, respectively, between the diode $D_1$ and the collector of the output transistor $Q_3$ and between the emitter of the NPN transistor $Q_2$ and the base of the output transistor $Q_3$ of the circuit shown in FIG. 4. By virtue of such circuit arrangement, a memory circuit having a high output breakdown voltage and a high threshold value can be obtained.

Figure 7:
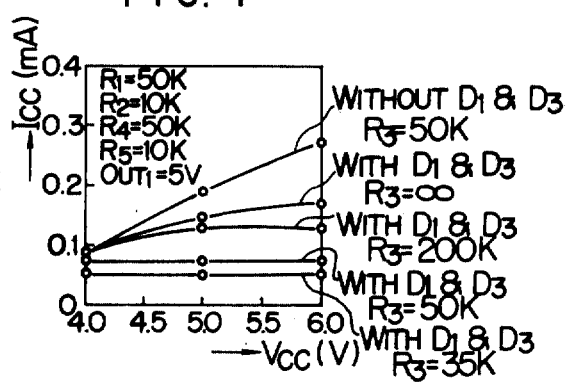
FIG. 7 illustrates exemplarily characteristics of the memory circuit shown in FIG. 6.

FIG. 7 graphically illustrates experimentally measured characteristics of the circuit shown in FIG. 6. In this figure, behavior of the source current $I_{cc}$ required for the ON holding state relative to variations in the source voltage $V_{cc}$ is illustrated with the resistor $R_3$ for controlling the saturation of the transistors $Q_1$ and $Q_2$ taken as a parameter.

It will be seen that, in the case of the hitherto known memory circuits shown in FIGS. 1 and 2 having no negative feedback loop or diodes $D_1$ and $D_3$, the source current Icc is linearly increased as a function of the increasement of the source voltage Vcc. On the contrary, in the case of the memory circuit according to the invention, the source current tends to be stabilized merely by connecting the feedback loop including the diodes $D_1$ and $D_3$. When the resistor $R_3$ is connected to lower the resistance value thereby to operate the transistor $Q_1$ and $Q_2$ in the active region, a perfectly stabilized current can be obtained for holding the circuit in the ON state.

As will be appreciated from the foregoing description, according to the invention, a semiconductor element circuit having equivalently the PNPN four-layer structure such as a transistor circuit comprising a combination of PNP and NPN transistors or a thyristor is employed in cooperation with a feedback circuit having a stabilized point in the state of the controlled saturation. The memory circuit of such arrangement not only exhibits the holding function as is in the case of the hitherto known memory circuit of the PNPN four-layer structure but also is capable of substantially eliminating the disadvantages of the conventional memory circuits such as extra power consumption due to the saturation of the component transistors, variation of current caused by variation of the source voltage and the low speed OFF switching, for example.

What is claimed is:

1. A memory circuit comprising:
   a semiconductor element circuit having equivalently a PNPN four-layer structure including a P-type emitter, an N-type base, a P-type base and an N-type emitter; and
   at least an NPN transistor and a diode; and wherein said N-type emitter of said semiconductor element circuit is connected to the base of said NPN transistor, said P-type base of said semiconductor element circuit is connected to the anode of said diode, the cathode of said diode being connected to the collector of said NPN transistor, said collector being used for a current absorbing terminal,
   whereby the NPN transistor is adapted to be set to a controlled saturation state by feeding current externally to the collector of said NPN transistor to thereby maintain the memory circuit in the ON state.

2. A memory circuit according to claim 1, further comprising a resistor having one terminal connected with the N-type base of the semiconductor element circuit and another terminal being used for another current absorbing terminal.

3. A memory circuit according to claim 1, further comprising a resistor connected between the P-type emitter and the N-type base of the semiconductor element circuit.

4. A memory circuit comprising:
   a semiconductor element circuit having equivalently a PNPN four-layer structure including a P-type emitter, an N-type base, a P-type base and an N-type emitter;
   first, second and third resistors;
   at least an NPN transistor; and
   a diode;
   wherein said N-type emitter of said semiconductor element circuit is connected to the base of said NPN transistor and said P-type base of said semiconductor element circuit is connected to the anode of said diode, the cathode of said diode being connected to the collector of said NPN transistor, said collector being used for a current absorbing terminal, one terminal of said first resistor is connected to said N-type base of said semiconductor element circuit, the other terminal of said first resistor being used for another current absorbing terminal, the second resistor is connected between said P-type base and said N-type emitter of said semiconductor element circuit, and the third resistor is connected between the base and the emitter of said NPN transistor.

5. A memory circuit comprising:
   a semiconductor element circuit having equivalently a PNPN four-layer structure including a P-type emitter, an N-type base, a P-type base and an N-type emitter;
   first, second, third and fourth resistors;
   at least an NPN transistor; and
   a diode;

wherein said N-type emitter of said semiconductor element circuit is connected to the base of said NPN transistor, said P-type base of said semiconductor element circuit is connected to the anode of said diode, the cathode of said diode being coupled to the collector of said NPN transistor through the fourth resistor, one terminal of said first resistor is connected to said N-type base of said semiconductor element circuit, the other terminal of the first resistor being used for a current absorbing terminal, the second resistor is connected between said P-type base and said N-type emitter of said semiconductor element circuit, and the third resistor is connected between the base and the emitter of said NPN transistor.

6. A memory circuit comprising:
a semiconductor element circuit having equivalently a PNPN four-layer structure including a P-type emitter used as an anode, an N-type base, a P-type base and an N-type emitter used as a cathode;
first, second and third resistors;
first, second and third diodes; and
at least an NPN transistor, wherein
said N-type emitter of said semiconductor element circuit is connected to the anode of said first diode, the cathode of said first diode being connected to the base of said NPN transistor, the cathode of said second diode is connected to the anode of said third diode, and said P-type base of said semiconductor element circuit is connected to the anode of said second diode, and cathode of said third diode is connected to the collector of said NPN transistor, one terminal of the first resistor is connected to said N-type base of said semiconductor element circuit and the other terminal of said first resistor being used for a current absorbing terminal, the second resistor is connected between said P-type base and said N-type emitter of said semiconductor element circuit, and the third resistor is connected between the base and the emitter of said NPN transistor.

7. A memory circuit comprising:
a semiconductor element circuit having equivalently a PNPN four-layer structure including a P-type emitter, an N-type base, a P-type base and an N-type emitter and inherently having a positive feedback loop circuit;
another feedback loop circuit in cooperation with the positive feedback loop circuit including an NPN transistor and at least one diode having its anode connected with said P-type base of said semiconductor element circuit and its cathode connected with the collector of said NPN transistor; and
means for setting said NPN transistor in a controlled saturation state for maintaining the memory circuit in an ON-state.

8. A memory circuit according to claim 7, in which the semiconductor element circuit includes a thyristor.

9. A memory circuit according to claim 7, in which the base of the NPN transistor is connected to the N-type emitter of the semiconductor element circuit, the collector and the emitter being adapted to be supplied with respective biases.

10. A memory circuit comprising:
a semiconductor element circuit having equivalent PNPN four-layer structure including a P-type emitter, an N-type base, a P-type base as the gate of said element circuit, and an N-type emitter and having an inherent positive feedback loop circuit;
a further feedback loop circuit connected with said positive feedback loop circuit and including an NPN transistor and a diode, said diode being connected to shunt excess gate current from said PNPN element circuit and having its anode connected with the P-type base of said semiconductor element circuit and its cathode coupled to the collector of said NPN transistor, the N-type emitter of said element circuit being connected with the base of said NPN transistor, with the potential at the collector of said NPN transistor being clamped so that said NPN transistor is held in the shallow saturation state to maintain the memory circuit in the ON-state.

* * * * *